US012107561B2

(12) United States Patent
Ojima

(10) Patent No.: US 12,107,561 B2
(45) Date of Patent: Oct. 1, 2024

(54) VIBRATOR AND METHOD FOR MANUFACTURING VIBRATOR

(71) Applicant: Murata Manufacturing Co., Ltd., Nagaokakyo (JP)

(72) Inventor: Shigeo Ojima, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 573 days.

(21) Appl. No.: 17/397,650

(22) Filed: Aug. 9, 2021

(65) Prior Publication Data

US 2021/0367579 A1 Nov. 25, 2021

Related U.S. Application Data

(63) Continuation of application No. PCT/JP2020/009694, filed on Mar. 6, 2020.

(30) Foreign Application Priority Data

Mar. 29, 2019 (JP) .................................. 2019-067622

(51) Int. Cl.
*H03H 9/10* (2006.01)
*H03H 3/02* (2006.01)
*H03H 9/19* (2006.01)

(52) U.S. Cl.
CPC ............ *H03H 9/1035* (2013.01); *H03H 3/02* (2013.01); *H03H 9/19* (2013.01); *H03H 2003/022* (2013.01)

(58) Field of Classification Search
CPC ................................ H03H 9/19; H03H 9/1035
See application file for complete search history.

(56) References Cited

U.S. PATENT DOCUMENTS

2004/0100164 A1* 5/2004 Murata ............... H03H 9/1085
310/348
2004/0232802 A1* 11/2004 Koshido .............. H03H 9/6483
29/25.35

(Continued)

FOREIGN PATENT DOCUMENTS

JP 2004129223 A 4/2004
JP 2004194290 A 7/2004

(Continued)

OTHER PUBLICATIONS

International Search Report issued for PCT/JP2020/009694, date of mailing Apr. 21, 2020.

*Primary Examiner* — Bryan P Gordon
(74) *Attorney, Agent, or Firm* — ArentFox Schiff LLP

(57) ABSTRACT

A method for manufacturing a vibrator that includes forming excitation electrodes, lead-out electrodes, and first sealing frames on the main surfaces of a crystal piece; forming second sealing frames on the main surfaces of a base part and a lid part; and sealing a crystal vibration element by bonding the first sealing frames to the second sealing frames. The first sealing frames each include a first Ti or Cr base layer 110, and a first Au surface layer. The first Ti or Cr base layers are thinner than the first Au surface layers. The second sealing frames each include a second Ni base layer, and a second AuSn surface layer. The second Ni base layers are thicker than the second AuSn surface layers. The sealing is carried out by alloying the first Au surface layers and the second AuSn surface layers to each other.

8 Claims, 9 Drawing Sheets

(56) References Cited

U.S. PATENT DOCUMENTS

| | | | |
|---|---|---|---|
| 2006/0131731 A1* | 6/2006 | Sato | H03H 9/105 |
| | | | 257/710 |
| 2008/0231145 A1 | 9/2008 | Nagano et al. | |
| 2011/0260585 A1* | 10/2011 | Ichikawa | H03H 9/0519 |
| | | | 310/344 |
| 2011/0309720 A1* | 12/2011 | Kawahara | H03H 9/1035 |
| | | | 29/25.35 |
| 2014/0312735 A1 | 10/2014 | Deillon et al. | |
| 2021/0367579 A1* | 11/2021 | Ojima | H03H 9/1035 |

FOREIGN PATENT DOCUMENTS

| | | |
|---|---|---|
| JP | 2006074567 A | 3/2006 |
| JP | 2006135264 A | 5/2006 |
| JP | 2006157504 A | 6/2006 |
| JP | 2006173557 A | 6/2006 |
| JP | 2008271491 A | 11/2008 |
| JP | 2015503276 A | 1/2015 |
| JP | 2015139053 A | 7/2015 |

* cited by examiner

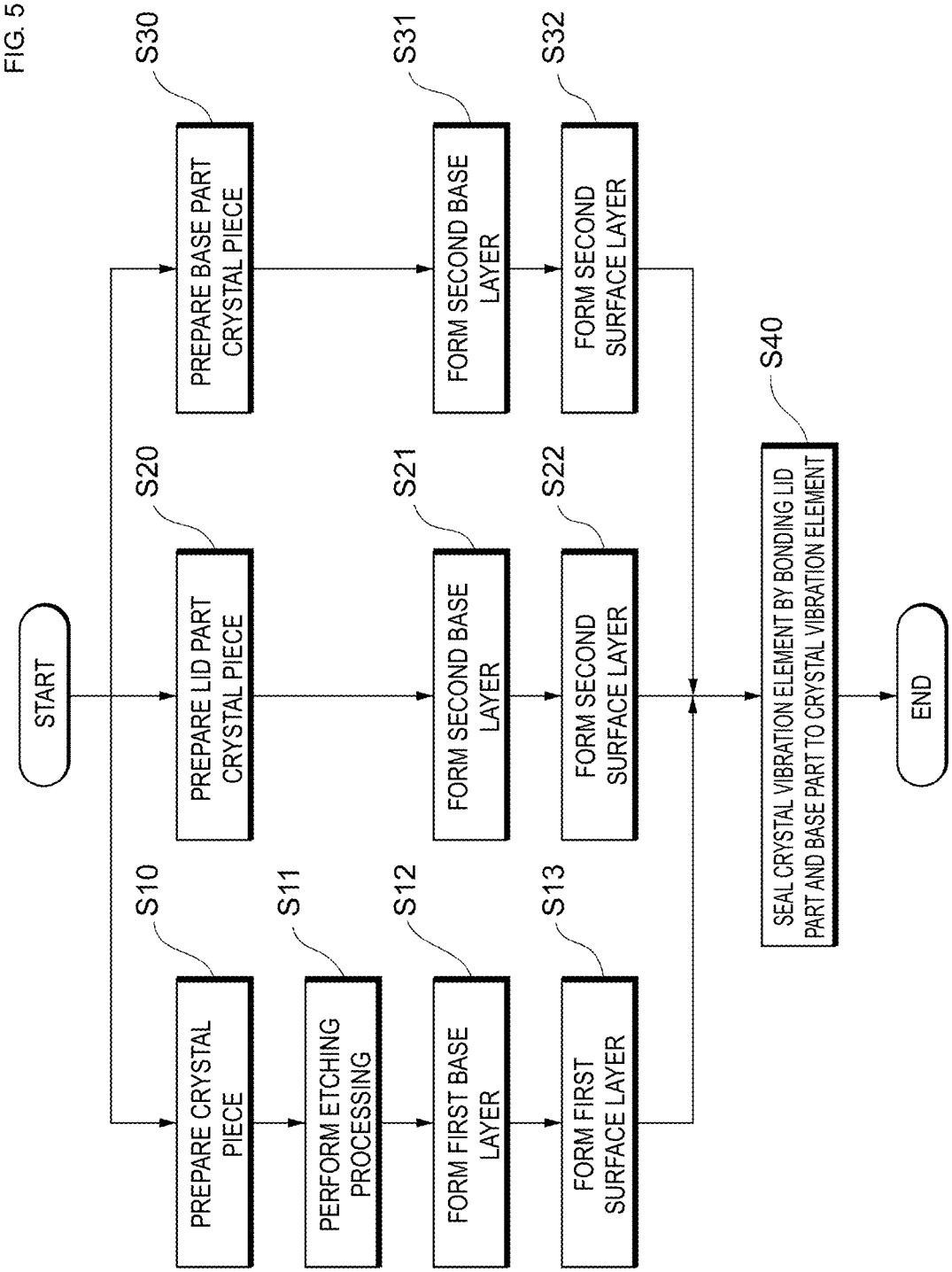

VIBRATOR AND METHOD FOR MANUFACTURING VIBRATOR

CROSS REFERENCE TO RELATED APPLICATIONS

The present application is a continuation of International application No. PCT/JP2020/009694, filed Mar. 6, 2020, which claims priority to Japanese Patent Application No. 2019-067622, filed Mar. 29, 2019, the entire contents of each of which are incorporated herein by reference.

FIELD OF THE INVENTION

The present invention relates to a vibrator and a method for manufacturing a vibrator.

BACKGROUND OF THE INVENTION

In recent years, size reduction of vibrators has been progressing. However, regarding the progress made in reducing the size of vibrators, sealing a vibrator, i.e., bonding a vibration element and a housing part to each other is more difficult than in the past. Furthermore, there may be increased demands on the manufacturing processes due to the size reduction of vibrators and there may be a fall in productivity for the vibrators. Therefore, there are demands for improvement of bonding stability and improvement of productivity for vibrators that have been reduced in size.

For example, Patent Document 1 discloses a piezoelectric vibration device in which a vibration-side first bonding pattern and a vibration-side second bonding pattern are formed by physical vapor deposition on the two main surfaces of a crystal vibration board, a sealing-side first bonding pattern is formed by physical vapor deposition on a first sealing member, a sealing-side second bonding pattern is formed by physical vapor deposition on a second sealing member, a Au layer of the sealing-side first bonding pattern and a Au layer of the vibration-side first bonding pattern are diffusion bonded to each other, a Au layer of the sealing-side second bonding pattern and a Au layer of the vibration-side second bonding pattern are diffusion bonded to each other, and in the second sealing member, physical vapor deposition formed connection terminals, which are for performing diffusion bonding to a functional section in which outer electrode terminals that are directly bonded to a circuit board, are formed. In other words, Patent Document 1 discloses diffusion bonding of a Au layer and a Au layer in a piezoelectric vibration device having a sandwich structure.

In addition, for example, Patent Document 2 discloses a method for manufacturing a glass lid in which a sealing metal film is provided on a sealing portion for hermetically sealing a package for accommodating a piezoelectric vibration piece. The method includes a film forming step in which a sealing metal film is deposited on the entirety of at least one surface of a flat glass sheet, an etching step in which a mask is disposed on the sealing metal film and etching is performed, a stacking step in which a plurality of glass sheets are stuck together in a stacked state after the etching step, and a cutting step in which the glass sheets in the stacked state are cut into individual pieces.

Patent Document 1: Japanese Unexamined Patent Application Publication No. 2015-139053
Patent Document 2: Japanese Unexamined Patent Application Publication No. 2006-157504

SUMMARY OF THE INVENTION

However, severe demands are made with respect to the flatness of the opposing bonding surfaces and the surfaces of the bonding patterns provided on those surfaces in the diffusion bonding of a Au layer and a Au layer in the piezoelectric vibration device disclosed in Patent Document 1. If the flatness of the surfaces of the Au layers of the bonding patterns is reduced due to undulation or warping of the crystal vibration board or due to variations in the thicknesses of the metal layers forming the bonding patterns, the Au layer and the Au layer may not be able to closely contact each other and it may not be possible to realize stable bonding. Furthermore, in the method for manufacturing a glass lid disclosed in Patent Document 2, the area of the top surface of a side wall of the substrate where brazing material is formed is small. Therefore, the forming step in which brazing material is formed on the top surface may be complicated and productivity may decrease.

The present invention was made in light of the above-described circumstances and it is an object thereof to provide a vibrator and a method for manufacturing a vibrator that enable good sealing performance to be realized through stable bonding and improved productivity to be obtained.

An aspect of the present invention provides a method for manufacturing a vibrator that includes forming respective excitation electrodes, connection electrodes, and first sealing layers on a first main surface and a second main surface of a vibration piece that are opposed to each other in a thickness direction of the vibration piece, wherein the first sealing layers each include a first Ti or Cr base layer and a first Au surface layer on the first base layer, and the first Ti or Cr base layers are thinner than the first Au surface layers; forming respective second sealing layers on main surfaces of each of a base part and a lid part, wherein the second sealing layers each include a second Ni base layer and a second AuSn surface layer on the second base layer, and the second Ni base layers are thicker than the second AuSn surface layers; and alloying the first Au surface layers and the second AuSn surface layers to each other so as to bond the second sealing layer of the base part and the first sealing layer of the first main surface of the vibration element to each other and bond the second sealing layer of the lid part and the first sealing layer of the second main surface of the vibration element to each other.

The present invention can provide a vibrator and a method for manufacturing a vibrator with which improved productivity can be realized and good sealing performance can be obtained through stable bonding.

BRIEF DESCRIPTION OF THE DRAWINGS

FIG. 5 is a flowchart for describing a method for manufacturing the crystal vibrator according to this embodiment.

DETAILED DESCRIPTION OF THE PREFERRED EMBODIMENTS

Hereafter, an embodiment of the present invention will be described. In the following description of the drawings, identical or similar constituent elements are denoted by identical or similar reference symbols. The drawings are representative, the dimensions and shapes of the individual parts are schematically illustrated, and the technical scope of the invention of the present application should not be interpreted as being limited to that of the embodiment.

Preferred Embodiment

Crystal Vibrator 1

Figure 1:
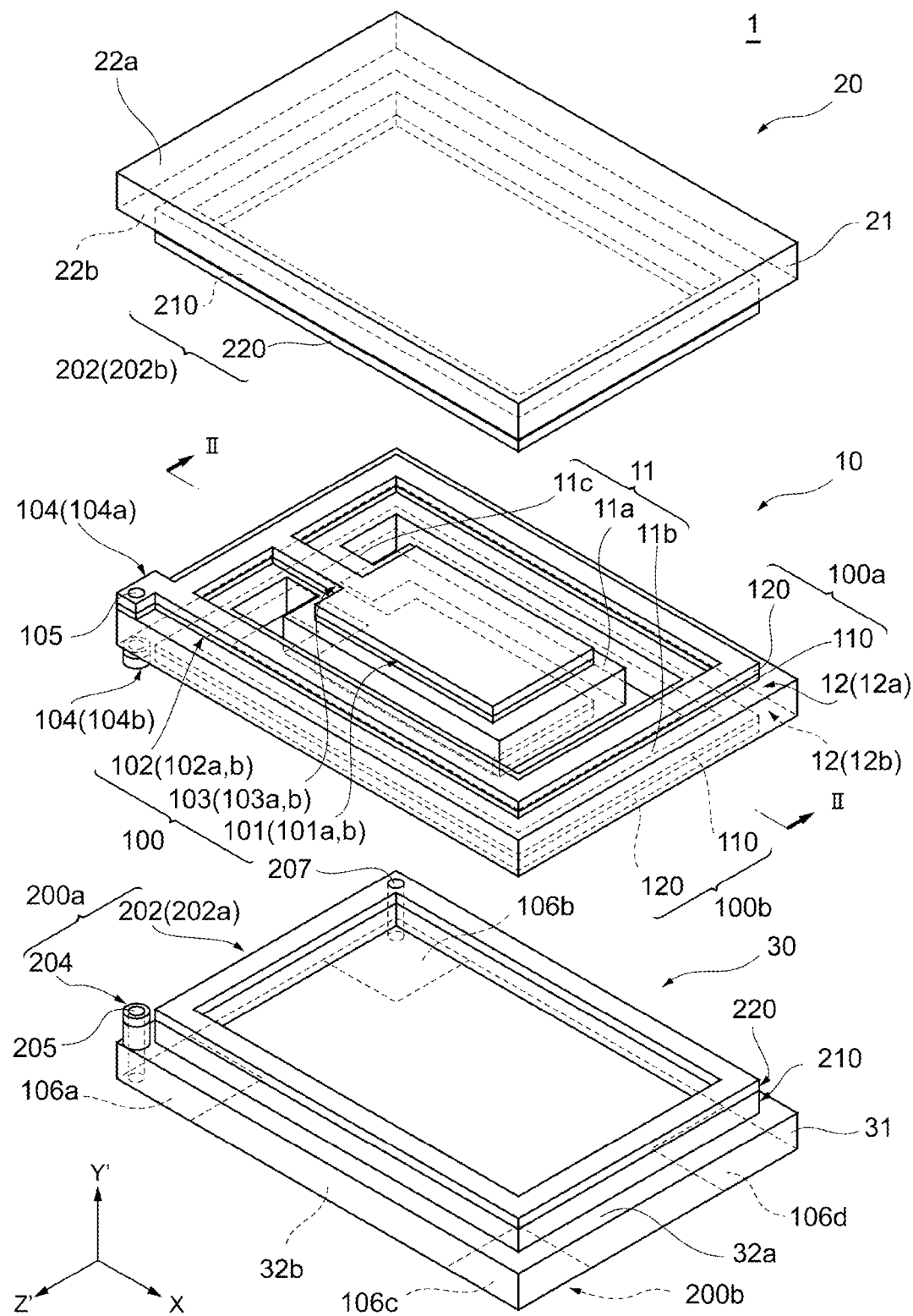
FIG. 1 is an exploded perspective view of a crystal vibrator according to an embodiment.
Figure 2:
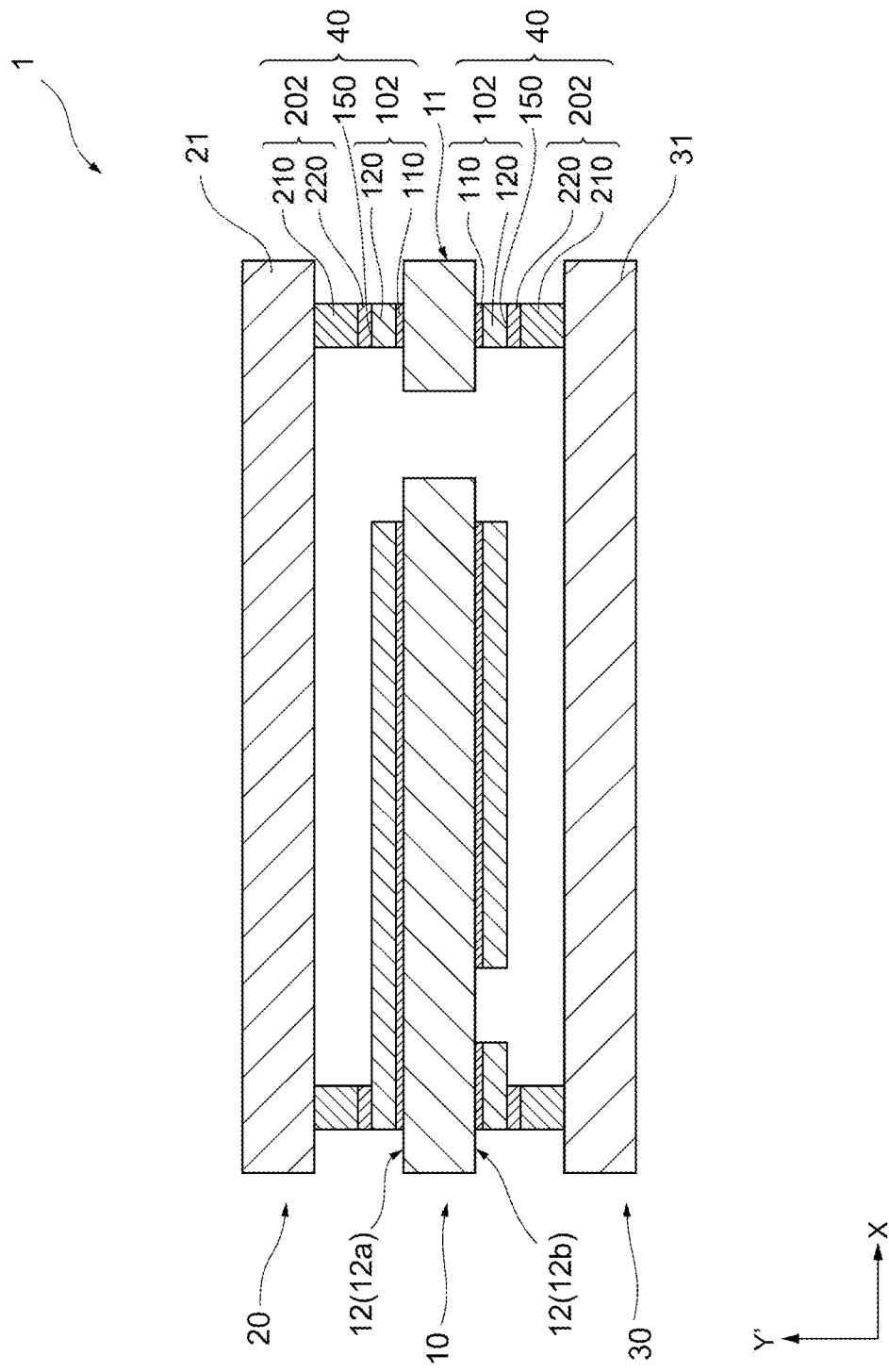
FIG. 2 is a sectional view taken along line II-II in FIG. 1.
Figure 3A:
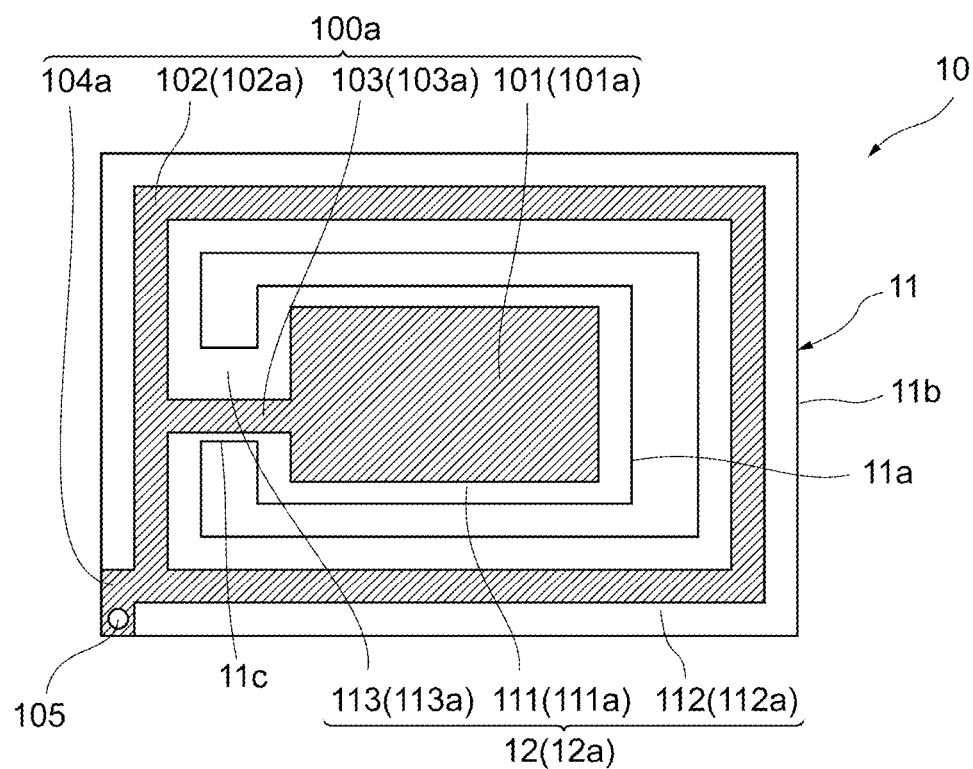
FIG. 3A is a diagram for describing the front-surface-side configuration of a crystal vibration element according to this embodiment.
Figure 3B:
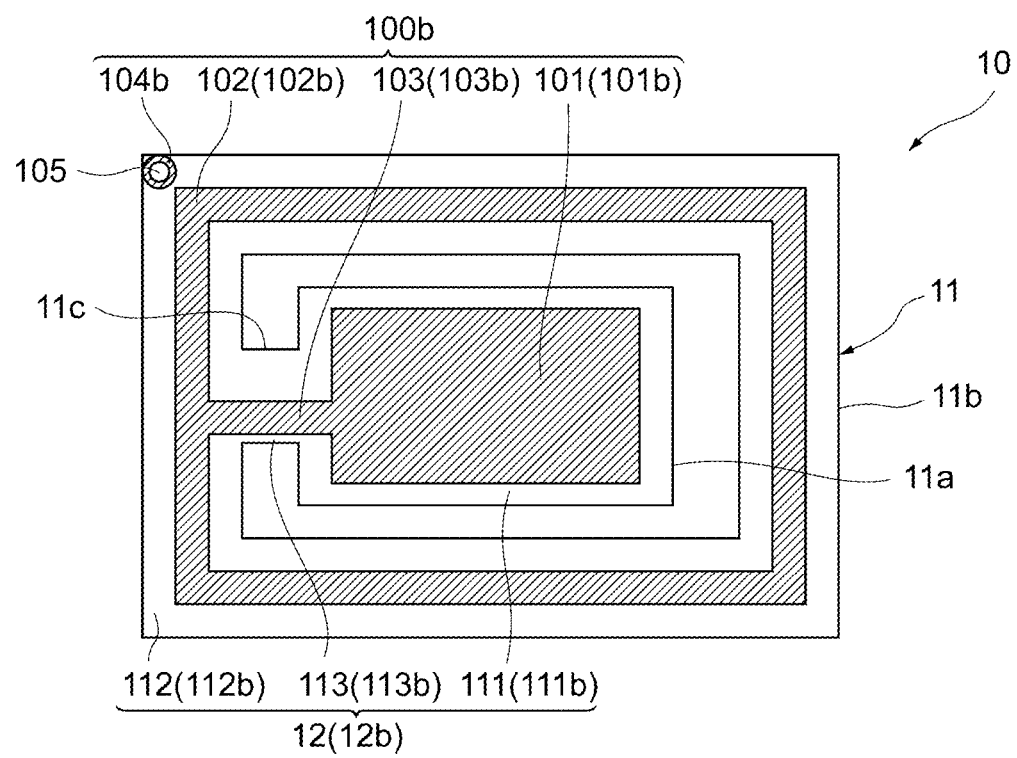
FIG. 3B is a diagram for describing the rear-surface-side configuration of the crystal vibration element according to this embodiment.
Figure 4A:
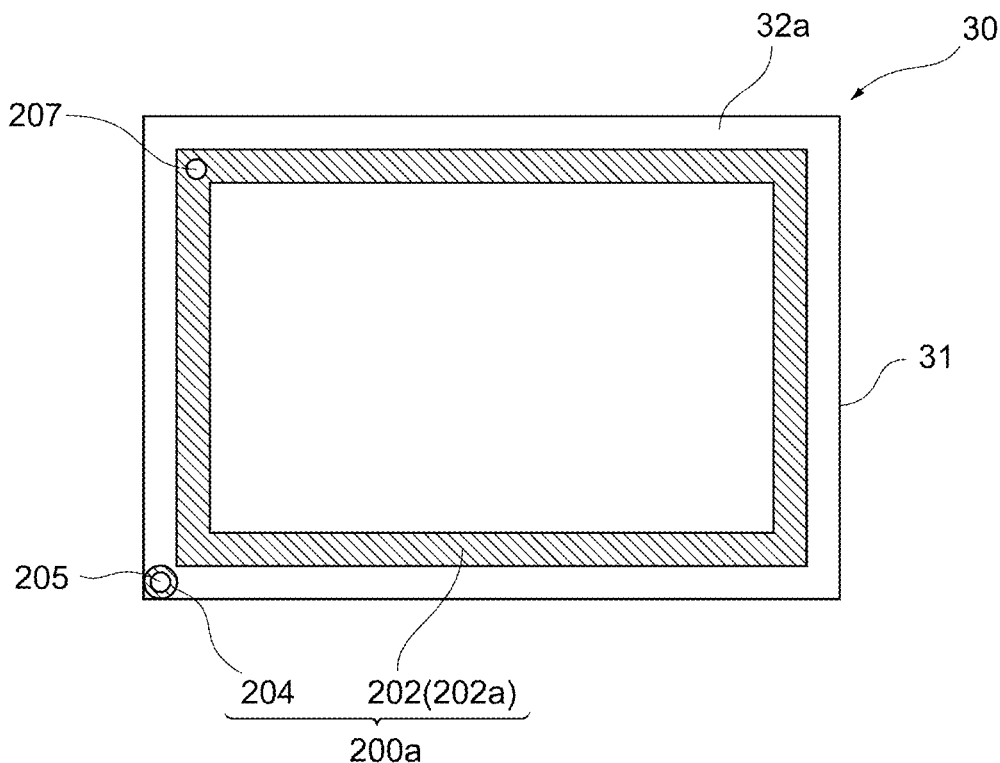
FIG. 4A is a diagram for describing the front-surface-side configuration of a base part according to this embodiment.
Figure 4B:
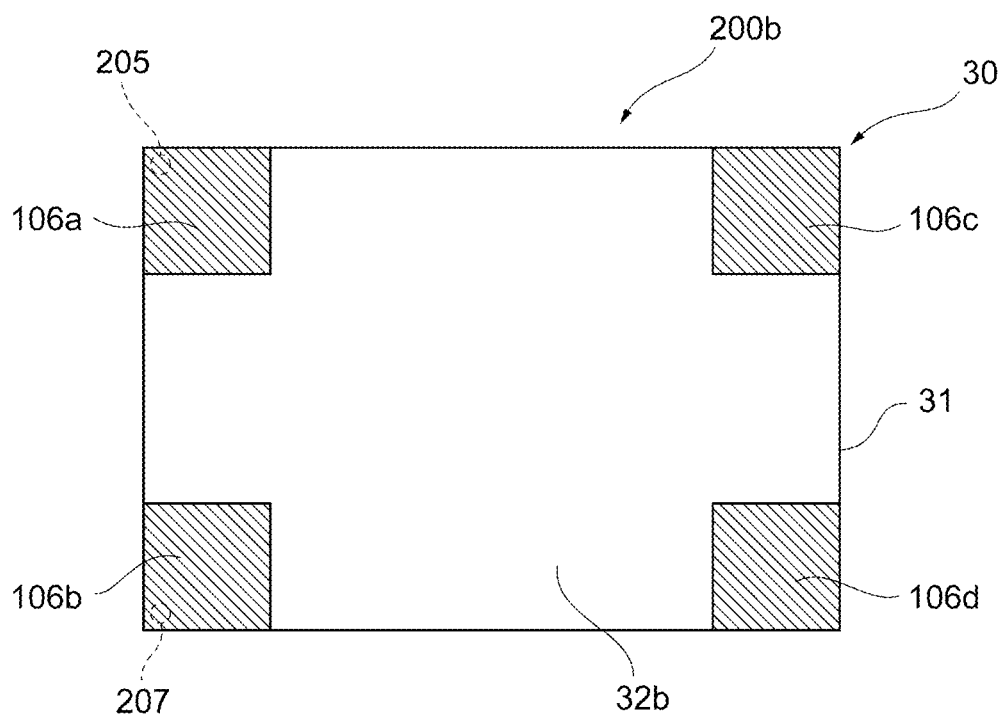
FIG. 4B is a diagram for describing the rear-surface-side configuration of the base part according to this embodiment.

First, a crystal vibrator (quartz crystal resonator unit) 1 according to this embodiment will be described while referring to FIGS. 1 to 4B. FIG. 1 is an exploded perspective view of the crystal vibrator 1 and FIG. 2 is a sectional view taken along line II-II in FIG. 1. Furthermore, FIGS. 3A and 3B are diagrams for describing a crystal vibration element 10, where FIG. 3A is a diagram for describing the front-surface-side configuration of the crystal vibration element 10 and FIG. 3B is a diagram for describing the rear-surface-side configuration of the crystal vibration element 10. FIGS. 4A and 4B are diagrams for describing a base part 30 according to this embodiment, where FIG. 4A is a diagram for describing the front-surface-side configuration of the base part 30 and FIG. 4B is a diagram for describing the rear-surface-side configuration of the base part 30. Note that illustration of some electrodes is omitted from FIG. 2.

The crystal vibrator 1 according to this embodiment includes a crystal vibration element (quartz crystal resonator) 10, a lid part 20, and a base part 30. In addition, the crystal vibrator 1 includes sealing layers 40, which serve as bonding materials. Here, the crystal vibrator 1 is an example of a vibrator and the crystal vibration element 10 is an example of a vibration element.

The crystal vibrator 1 is a vibrator having a sandwich structure, i.e., a wafer level package (WLP) sealing structure that is formed by bonding the crystal vibration element 10 and the lid part 20 to each other using a sealing layer 40 and bonding the crystal vibration element 10 and the base part 30 to each other using a sealing layer 40 in a thickness direction of the crystal vibrator 1. In other words, the crystal vibration element 10 is sandwiched and sealed between the lid part 20 and the base part 30, which are respectively bonded to opposed main surfaces of the crystal vibration element 10 on both sides in the thickness direction of the crystal vibration element 10. In addition, in this embodiment, the crystal vibration element 10, the lid part 20, and the base part 30 have rectangular shapes having identical dimensions and the directions of the long and short sides of the rectangular shapes are aligned with each other when the crystal vibrator 1 is viewed in plan view in the thickness direction of the crystal vibrator 1.

Crystal Vibration Element 10

The crystal vibration element 10 is shaped as a flat plate. Furthermore, the crystal vibration element 10 includes a crystal piece 11 and a metal layer 100a and a metal layer 100b that are provided on opposed main surfaces 12a and 12b, respectively, of the crystal piece 11 in the thickness direction of the crystal piece 11.

Here, the crystal piece 11 according to this embodiment is an AT cut crystal piece. The AT cut crystal piece is obtained by cutting a synthetic crystal (synthetic quartz crystal) such that main surfaces thereof are surfaces that are parallel to a plane defined by an X axis and a Z' axis (Hereafter, referred to as an "XZ' plane". Similar definitions are used for planes specified using the other axes), where a Y' axis and a Z' axis are axes that are respectively obtained by rotating the Y axis and the Z axis 106° 15'±1' 30" around the X axis in a direction from the Y axis toward the Z axis, among an X axis, a Y axis, and a Z axis, which are the crystallographic axes of the crystal. The crystal vibration element 10, which employs the AT cut crystal piece 11, uses a thickness shear vibration mode as a main vibration. In addition, a thickness direction of the crystal piece 11 according to this embodiment is parallel to the Y' axis direction. When the crystal piece 11 is viewed in plan view in the Y' axis direction, the XZ' surfaces of the crystal piece 11 have a rectangular shape with the long sides of the rectangular shape being parallel to the X axis direction and the short sides of the rectangular shape being parallel to the Z' axis direction.

In the following description, each constituent part of the crystal vibrator 1 will be described with reference to the X, Y', and Z' axis directions of the AT cut. In addition, unless there are any special descriptions, "in plan view" means viewing these constituent parts in plan view along the thickness direction (Y' axis direction) of the constituent parts of the crystal vibrator 1. When these constituent parts are viewed in plan view along two or more axis directions, descriptions such as "in the XZ' plane," "in the XY' plane," and "in the Y'Z' plane" are used to distinguish between the directions. In addition, "XY' plane" refers to a cross section along the thickness direction. Furthermore, the shapes that can be seen when the crystal vibration element 10, the lid part 20, the base part 30, and the constituent parts of these components are seen in plan view are referred to as the "plan view shapes" of the crystal vibration element 10, the lid part 20, the base part 30, and the constituent parts of these components. In addition, a state in which the crystal vibrator 1 has been constructed by assembling the crystal vibration element 10, the lid part 20, and the base part 30 may be referred to as an "assembled state".

The description will now return to description of the crystal vibration element 10. The crystal piece 11 is an example of a vibration piece and has a flat-plate-shaped structure having a uniform thickness. In addition, the crystal piece 11 includes a central portion 11a, a peripheral portion 11b that is provided so as to surround the central portion 11a along the periphery of the central portion 11a, and a connecting portion 11c that connects the central portion 11a and the peripheral portion 11b to each other. In plan view, the outer edges of the central portion 11a, the peripheral portion 11b, and connecting portion 11c have rectangular shapes. In addition, the central portion 11a is separated from the frame-shaped peripheral portion 11b by a U-shaped cut out part around the periphery of the central portion 11a.

Furthermore, the crystal piece 11 has a first main surface 12a and a second main surface 12b that are on opposed sides of the crystal piece 11 in the thickness direction, i.e., are XZ' surfaces that face each other. The first main surface 12a is a front surface of the crystal piece 11 and is formed of a central portion main surface 111a of the central portion 11a, a peripheral portion main surface 112a of the peripheral portion 11b, and a connecting portion main surface 113a of the connecting portion 11c, which are on the positive Y' axis direction side. The second main surface 12b is a rear surface of the crystal piece 11 and is formed of a central portion main surface 111b of the central portion 11a, a peripheral portion main surface 112b of the peripheral portion 11b, and a connecting portion main surface 113b of the connecting portion 11c, which are on the negative Y' axis direction side. Hereafter, when not distinguishing between the first main surface 12a and the second main surface 12b, the first main surface 12a and the second main surface 12b will be just referred to as "main surfaces 12". In addition, the other central portion main surfaces 111a and 111b and so forth will be similarly referred to as "central portion main surfaces 111", "peripheral portion main surfaces 112", and "connecting portion main surfaces 113" when not distinguishing between them.

The metal layer 100a is an alloy layer and is provided on the first main surface 12a of the crystal piece 11. The metal layer 100a includes an excitation electrode 101a, a first sealing frame 102a, a lead-out electrode 103a, and a connection electrode 104a. The excitation electrode 101a, the first sealing frame 102a, the lead-out electrode 103a, and the connection electrode 104a are formed so as to be integrated with each other. Specifically, the excitation electrode 101a is provided on the central portion main surface 111a, the first sealing frame 102a is provided on the peripheral portion main surface 112a, and the lead-out electrode 103a is provided on the connecting portion main surface 113a. In addition, the connection electrode 104a is provided on the peripheral portion main surface 112a at a corner of the outer edge of the peripheral portion main surface 112a further toward the outside than the first sealing frame 102a.

The metal layer 100b is an alloy layer of the same material as the metal layer 100a and is provided on the second main surface 12b of the crystal piece 11. The metal layer 100b includes an excitation electrode 101b, a first sealing frame 102b, a lead-out electrode 103b, and a connection electrode 104b. However, in contrast to the metal layer 100a, in the metal layer 100b, the excitation electrode 101b, the first sealing frame 102b, and the lead-out electrode 103b are formed so as to be integrated with each other, but the connection electrode 104b is separated from the excitation electrode 101b, the first sealing frame 102b, and the lead-out electrode 103b. Specifically, the excitation electrode 101b is provided on the central portion main surface 111b, the first sealing frame 102b is provided on the peripheral portion main surface 112b, and the lead-out electrode 103b is provided on the connecting portion main surface 113b. In addition, the connection electrode 104b is provided on the peripheral portion main surface 112b at a corner of the outer edge of the peripheral portion main surface 112b further toward the outside than the first sealing frame 102b.

The excitation electrode 101a and the excitation electrode 101b have the same configurations as each other and the plan view shapes thereof are rectangular shapes. In addition, the excitation electrode 101a and the excitation electrode 101b are provided on the central portion main surface 111a and the central portion main surface 111b so as to face each other across the central portion 11a and are disposed so as to overlap in plan view. Thus, the excitation electrode 101a and the excitation electrode 101b form a pair of excitation electrodes for obtaining a vibration part in which the main vibration mode is a thickness shear vibration when a voltage is applied to the central portion 11a.

The first sealing frame 102a and the first sealing frame 102b are examples of first sealing layers of the sealing layers 40 and have the same configurations as each other and the plan view shapes thereof are frame shapes. The plan view shapes of the inner and outer periphery surfaces of the frame shapes are also rectangular. In addition, the first sealing frame 102a and the first sealing frame 102b are provided on the peripheral portion main surface 112a and the peripheral portion main surface 112b so as to face each other across the peripheral portion 11b and are disposed so as to overlap in plan view. Thus, the first sealing frame 102a and the first sealing frame 102b form parts of the sealing layers 40 used as a bonding material when the crystal vibration element 10 is sealed.

Additionally, the first sealing frame 102b functions as a connection electrode that is electrically connected to a second sealing frame 202a of the base part 30 described later.

The lead-out electrode 103a and the lead-out electrode 103b are examples of connection electrodes and have the same configuration. Furthermore, the lead-out electrode 103a and the lead-out electrode 103b are provided on the connecting portion main surface 113a and the connecting portion main surface 113b so as to face each other across the central portion 11a and the lead-out electrode 103a and the lead-out electrode 103b are disposed so as to not overlap in plan view. Thus, the connecting portion 11c can reduce vibrations caused by the lead-out electrode 103a and the lead-out electrode 103b, that is, vibrations generated when the lead-out electrode 103a and the lead-out electrode 103b are disposed so as to overlap.

The connection electrode 104a and the connection electrode 104b are examples of connection electrodes and have different shapes from each other. Furthermore, the connection electrode 104a and the connection electrode 104b are connected to each other by a connection hole 105 provided so as to penetrate through the connection electrode 104a, the crystal piece 11, and the connection electrode 104b in the thickness direction of the crystal piece 11. For example, the inner wall of the connection hole 105 is metalized in order to electrically connect the connection electrode 104a and the connection electrode 104b to each other.

Thus, in this embodiment, the metal layer 100a and the metal layer 100b have the same configuration except for the connection electrode 104a and the connection electrode 104b. Therefore, in the following description, the metal layer 100a without the connection electrode 104a and the metal layer 100b without the connection electrode 104b are referred to as "first metal layers 100" when not distinguishing between the metal layer 100a and the metal layer 100b. In addition, similarly, when not distinguishing between the excitation electrode 101a and the excitation electrode 101b and so forth, these components are collectively referred to as "excitation electrodes 101", "first sealing frames 102", "lead-out electrodes 103", and "connection electrodes 104". Furthermore, the material of the first metal layers 100 will be described in detail later.

Lid Part 20

The lid part 20 is shaped as a flat plate. Furthermore, the lid part 20 includes a lid part crystal piece 21 and a second sealing frame 202b provided on the lid part crystal piece 21.

The lid part crystal piece 21 is an AT cut crystal piece and has a flat-plate-shaped structure having a uniform thickness. In addition, the lid part crystal piece 21 has a main surface 22a and a main surface 22b that are on both sides in the thickness direction, i.e., that are XZ' surfaces that face each other. In the assembled state, the plan view shapes of the XZ' surfaces, which are outer peripheral surfaces, of the lid part crystal piece 21 are the same as those of the crystal piece 11 of the crystal vibration element 10. In other words, the lid part crystal piece 21 and the crystal piece 11 are formed so as to overlap along the XZ' plane.

The second sealing frame 202b is an example of a second sealing layer and is provided on the main surface 22b. In the assembled state, the second sealing frame 202b is bonded to the first sealing frame 102a of the crystal vibration element 10 and forms, together with the first sealing frame 102a, the sealing layer 40 between the lid part 20 and the crystal vibration element 10. In addition, in the assembled state, the plan view shape of the second sealing frame 202b is the same as that of the first sealing frame 102 of the crystal vibration element 10. In other words, the second sealing frame 202b and the first sealing frame 102 of the crystal vibration element 10 are formed so as to overlap along the XZ' plane. On the other hand, the thickness of the second sealing frame 202b may be different from the thickness of the first sealing frame 102 in the XY' plane. This difference will be described in detail in the detailed description of the second sealing frame 202b given later.

Base Part 30

The base part 30 is shaped as a flat plate. In addition, the base part 30 includes a base part crystal piece 31 and a metal layer 200a and a metal layer 200b that are provided on opposed main surfaces of the base part crystal piece 31 in the thickness direction of the base part crystal piece 31.

The base part crystal piece 31 is an AT cut crystal piece and has a flat-plate-shaped structure having a uniform thickness. In addition, the base part crystal piece 31 has a main surface 32a and a main surface 32b that are on both sides in the thickness direction, i.e., that are XZ' surfaces that face each other. In the assembled state, the plan view shapes of the XZ' surfaces, which are outer peripheral surfaces, of the base part crystal piece 31 are the same as those of the crystal piece 11 of the crystal vibration element 10. In other words, the base part crystal piece 31 and the crystal piece 11 are formed so as to overlap along the XZ' plane.

The metal layer 200a is an alloy layer and is provided on the main surface 32a. The metal layer 200a includes the second sealing frame 202a and a connection electrode 204. Furthermore, the second sealing frame 202a and the connection electrode 204 are provided so as to be separated from each other. The second sealing frame 202a is located along the periphery of the main surface 32a of the base part 30 and the connection electrode 204 is provided at a corner of the outer edge of the main surface 32a further toward the outside than the second sealing frame 202a.

The second sealing frame 202a is an example of a second sealing layer, is bonded to the first sealing frame 102b of the crystal vibration element 10 in the assembled state and forms the sealing layer 40 together with the first sealing frame 102b. Furthermore, a connection hole 207, which penetrates through the second sealing frame 202a and the base part crystal piece 31, is formed in the thickness direction of the base part crystal piece 31 at a corner of the second sealing frame 202a located on the negative X axis direction side and the negative Z' axis direction side. Here, except for the connection hole 207, the second sealing frame 202a and the second sealing frame 202b of the lid part 20 have exactly the same configuration, and therefore description of the arrangement position and so forth of the second sealing frame 202a is omitted. In addition, the second sealing frame 202a and an outer electrode 106b, which is provided on the main surface 32b and is described later, are connected to each other and an electrical connection is realized therebetween by metalizing the inner wall of the connection hole 207, for example. Thus, the second sealing frame 202a functions as a connection electrode that is connected to the outer electrode 106b.

In the following description, when not distinguishing between the second sealing frame 202a of the base part 30 and the second sealing frame 202b of the lid part 20, these sealing frames will be referred to as "second sealing frames 202". The material of the second sealing frames 202 will be described in detail later in conjunction with description of the material of the first sealing frames 102.

The connection electrode 204 is provided at a position facing the connection electrode 104b of the crystal vibration element 10 so that the connection electrode 204 can be connected to the connection electrode 104b in the assembled state. Furthermore, a connection hole 205, which penetrates through the connection electrode 204 and the base part crystal piece 31, is formed in the connection electrode 204 in the thickness direction of the base part crystal piece 31. The connection electrode 204 and an outer electrode 106a, which will be described later, are connected to each other and an electrical connection is established therebetween by metalizing the inner wall of the connection hole 205, for example. Furthermore, in this embodiment, the connection hole 205 and the connection hole 105 of the crystal vibration element 10 are formed so as to overlap along the XZ' plane.

The metal layer 200b is, for example, an alloy layer formed by stacking a Ni layer and a Au layer. The metal layer 200b is provided on the main surface 32b and includes outer electrodes 106a, 106b, 106c, and 106d, which are terminals for realizing electrical connections to a mounting substrate, which is not illustrated. The outer electrodes 106a, 106b, 106c, and 106d are provided at the four corners of the main surface 32b. Furthermore, the outer electrodes 106a and 106b are input/output electrodes to and from which input/output signals of the crystal vibration element 10 are supplied and the outer electrodes 106c and 106d are electrodes to and from which input/output signals are not supplied to the crystal vibration element 10 and other electronic elements on the mounting substrate, which is not illustrated.

The outer electrode 106a is electrically connected to the connection electrode 104a via the connection hole 205, the connection electrode 204, the connection electrode 104b, and the connection hole 105. In addition, the excitation electrode 101a is integrally formed with and electrically connected to the connection electrode 104a via the lead-out electrode 103a and the first sealing frame 102a. Therefore, the outer electrode 106a is electrically connected to the excitation electrode 101a and supplies input/output signals to and from the excitation electrode 101a.

The outer electrode 106b is electrically connected to the first sealing frame 102b via the connection hole 207 and the second sealing frame 202a. Furthermore, the excitation electrode 101b is integrally formed with and electrically connected to the first sealing frame 102b via the lead-out electrode 103b. Therefore, the outer electrode 106b is electrically connected to the excitation electrode 101b and supplies input/output signals to and from the excitation electrode 101b.

In this embodiment, the lid part 20 is bonded to the crystal vibration element 10 by thermally bonding the second sealing frame 202b of the lid part 20 and the first sealing frame 102a of the crystal vibration element 10 to each other. In addition, the base part 30 is bonded to the crystal vibration element 10 by thermally bonding the second sealing frame 202a of the base part 30 and the first sealing frame 102b of the crystal vibration element 10 to each other. Thus, the crystal vibrator 1 is formed by sealing the crystal vibration element 10 between the lid part 20 and the base part 30.

In addition, in the crystal vibrator 1, the central portion 11a of the crystal piece 11 is made to vibrate with a prescribed vibration mode such as a thickness shear vibration mode and resonance characteristics are obtained along with this vibration by applying an alternating electric field between the pair of excitation electrodes 101a and 101b of the crystal vibration element 10 via the outer electrodes 106a and 106b of the base part 30.

Details of First Metal Layers 100, Second Sealing Frames 202, and Sealing Layers 40

Next, the first metal layers 100, the second sealing frames 202, and the sealing layers 40 according to this embodiment will be described in detail while referring to FIGS. 1 and 2. Hereafter, the respective materials of the first metal layers 100 and the second sealing frames 202 before being alloyed by bonding are described, and then the sealing layers 40 after having been alloyed by bonding will be described.

Each first metal layer 100 is, for example, an alloy layer that is formed by stacking two different metal layers. The thicknesses of the alloy layer and the metal layers forming the alloy layer thereof are uniform. The first metal layers 100 according to this embodiment each include a first base layer 110 provided on the corresponding main surface 12 of the crystal piece 11 and a first surface layer 120 provided on the first base layer 110 in a direction away from the corresponding main surface 12 of the crystal piece 11.

The first base layers 110 are PVD films formed by physical vapor deposition using a sputtering method on the main surfaces 12 of the crystal piece 11. In addition, in this embodiment, the first base layers 110 are for example, Ti layers or Cr layers. The thickness of each first base layer 110 is 1 to 20 nm. In addition, it is preferable that the thickness of each first base layer 110 be 1 to 10 nm.

The first surface layers 120 are PVD films formed by physical vapor deposition using a sputtering method on the first base layers 110 formed on the main surfaces 12 of the crystal piece 11. In addition, in this embodiment, the first surface layers 120 are Au layers, for example. The first surface layers 120 are formed to be thicker than the first base layers 110 and have a thickness of 50 to 500 nm. In addition, the thickness of each first surface layer 120 is preferably 100 to 200 nm.

Furthermore, as described above, the first metal layers 100 include the excitation electrodes 101, the first sealing frames 102, and the lead-out electrodes 103. Therefore, similarly to the material configuration of the first metal layers 100 described above, the excitation electrodes 101, the first sealing frames 102, and the lead-out electrodes 103 are formed of the parts of the first base layers 110 and the parts of the first surface layers 120 corresponding to excitation electrodes 101, the first sealing frames 102, and the excitation electrodes 103. In addition, the connection electrode 104a and the connection electrode 104b are composed of the same material as the first metal layers 100 and have the same thickness as the first metal layers 100. In the following description, the parts of the first base layers 110 and the parts of the first surface layers 120 corresponding to the first sealing frames 102 are simply referred to as "the first base layers 110 of the first sealing frames 102" and "the first surface layers 120 of the first sealing frame 102", respectively.

Each second sealing frame 202 is, for example, an alloy layer that is formed by stacking two different metal layers and consists of different materials from the first metal layers 100. The thicknesses of the alloy layers of the second sealing frames 202 and the metal layers forming the alloy layers thereof are uniform. In this embodiment, the second sealing frames 202 include second base layers 210 provided on the main surface 22b of the lid part 20 and the main surface 32a of the base part 30 and second surface layers 220 provided on the second base layers 210 in directions away from the main surface 22b of the lid part 20 and the main surface 32a of the base part 30.

The second base layers 210 are metal films formed using an electroless or electrolytic plating method on the main surface 22b of the lid part 20 and the main surface 32a of the base part 30. In this embodiment, the second base layers 210 are Ni layers, for example. Furthermore, the second base layers 210 have a function of allowing adjustment of the spacing between the lid part 20 and the crystal vibration element 10 and the spacing between the base part 30 and the crystal vibration element 10 in the thickness direction. In other words, the second base layers 210 have a thickness such that, in the assembled state, the central portion 11a of the crystal vibration element 10 does not interfere with the base part 30 or the lid part 20 when the crystal vibration element 10 vibrates.

In this embodiment, the second base layers 210 are formed so as to be thicker than the first surface layers 120 and have a thickness of 500 to 5000 nm. In addition, it is preferable that the thickness of each second base layer 210 be 1000 to 3000 nm. Furthermore, when viewed in relation to the thickness of the first surface layers 120, the thickness of each second base layer 210 is around five times or more the thickness of each first surface layer 120. In addition, the thickness of each second base layer 210 is preferably around ten times or more that of each first surface layer 120. In other words, the thickness of each second base layer 210 lies in a range from 500 to 5000 nm and is preferably around five times or more the thickness of each first surface layer 120. In addition, the thickness of each second base layer 210 more preferably lies in a range from 1000 to 3000 nm and is more preferably around ten times or more the thickness of each first surface layer 120.

The second surface layers 220 are metal films formed by heating or vapor depositing a metal paste onto the second base layers 210 formed on the main surface 22b of the lid part 20 and the main surface 32a of the base part 30. In this embodiment, the second surface layers 220 are AuSn layers, for example. The second base layers 210 are an example of a brazing material for bonding with the first surface layers 120. Furthermore, the second surface layers 220 are thinner than the second base layers 210.

In the assembled state, the sealing layers 40 are provided between the lid part 20 and the crystal vibration element 10 and between the base part 30 and the crystal vibration element 10 and are an example of sealing layers for bonding the lid part 20 and the base part 30 to the crystal vibration element 10. In this embodiment, each sealing layer 40 is formed by bonding the corresponding first sealing frame 102 and second sealing frame 202 to each other. In more detail, during assembly, each sealing layer 40 is formed by part of the second surface layer 220, which is a AuSn layer, of the second sealing frame 202, melting due to being heated and then alloying with the first surface layer 120, which is a Au layer, of the first sealing frame 102. In other words, each sealing layer 40 includes the first base layer 110, the first surface layer 120, the alloy layer 150, which is formed of part of the first surface layer 120 and part of second surface layer 220, the second surface layer 220, and the second base layer 210 from the main surface 12 of the crystal vibration element 10 toward the lid part 20 or the base part 30. In addition, the alloy layers 150 are composed of Au+AuSn.

Method of Manufacturing Crystal Vibrator 1

Figure 6A:
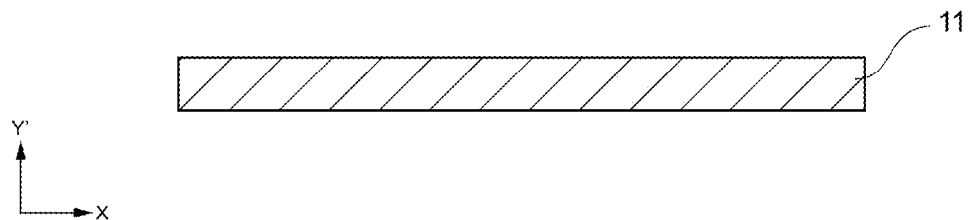
FIG. 6A is a diagram for describing in detail the method for manufacturing the crystal vibration element in Step 10 in FIG. 5.
Figure 6B:
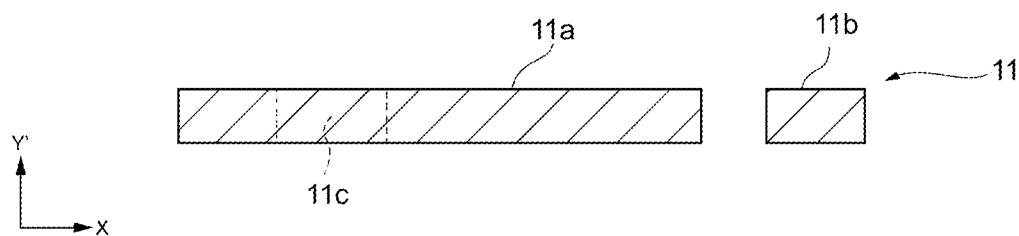
FIG. 6B is a diagram for describing in detail the method for manufacturing the crystal vibration element in Step 11 in FIG. 5.
Figure 6C:
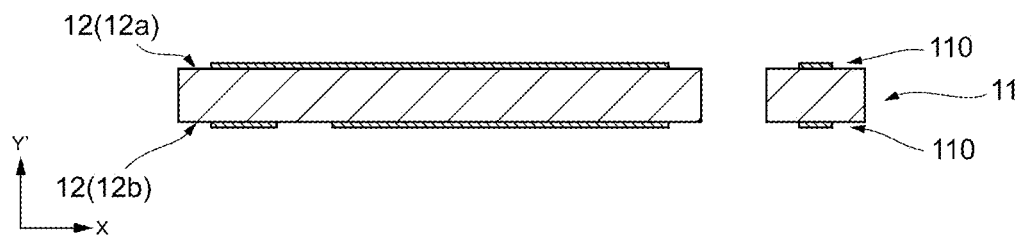
FIG. 6C is a diagram for describing in detail the method for manufacturing the crystal vibration element in Step 12 in FIG. 5.
Figure 6D:
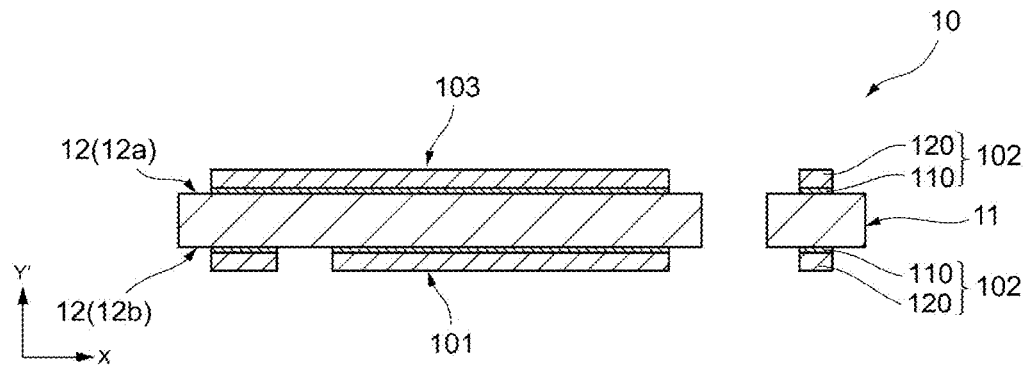
FIG. 6D is a diagram for describing in detail the method for manufacturing the crystal vibration element in Step 13 in FIG. 5.
Figure 7A:
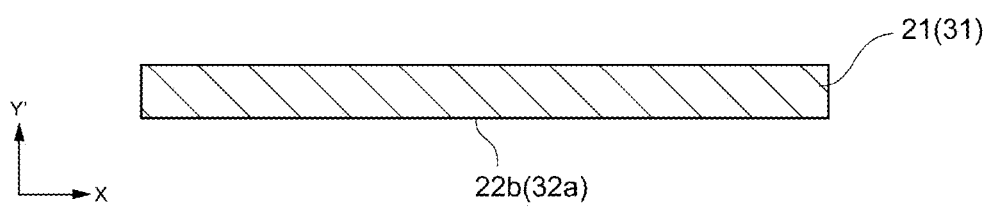
FIG. 7A is a diagram for describing in detail a method for manufacturing a lid part and a base part in Steps S20 and S30 in FIG. 5.
Figure 7B:
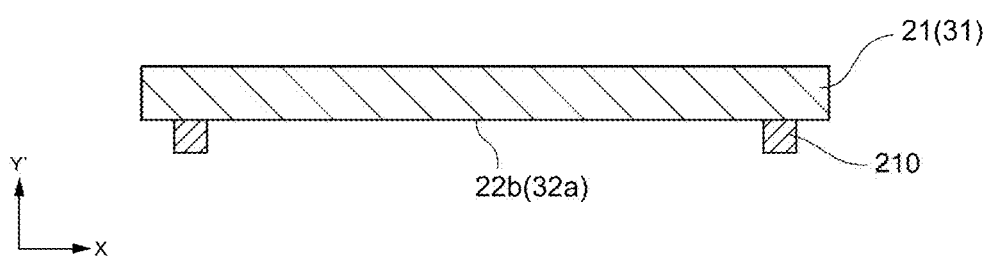
FIG. 7B is a diagram for describing in detail a method for manufacturing the lid part and the base part in Steps S21 and S31 in FIG. 5.
Figure 7C:
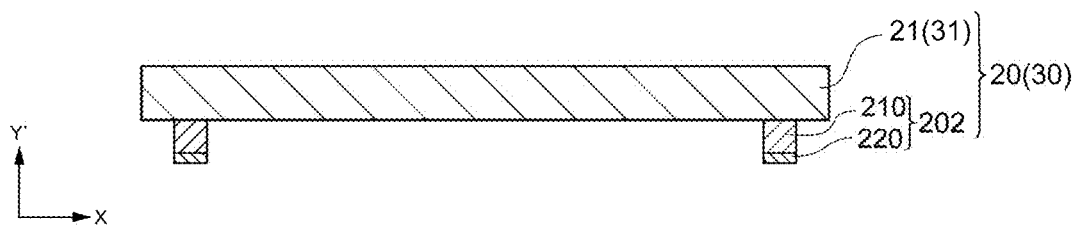
FIG. 7C is a diagram for describing in detail a method for manufacturing the lid part and the base part in Steps S22 and S32 in FIG. 5.
Figure 8A:
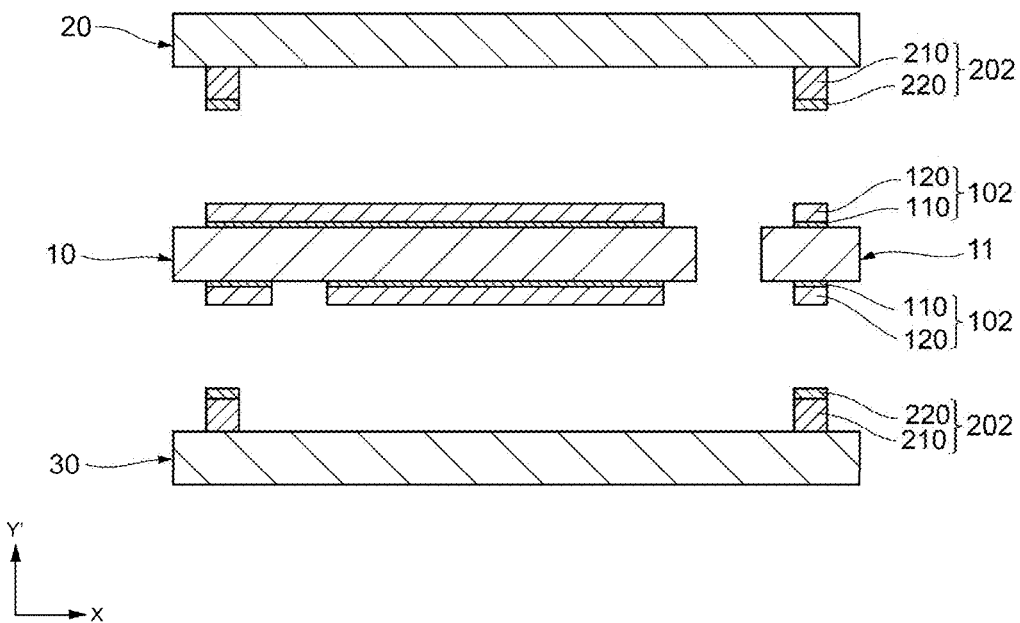
FIG. 8A is a diagram for describing in detail the method for manufacturing the crystal vibrator in Step 40 in FIG. 5.
Figure 8B:
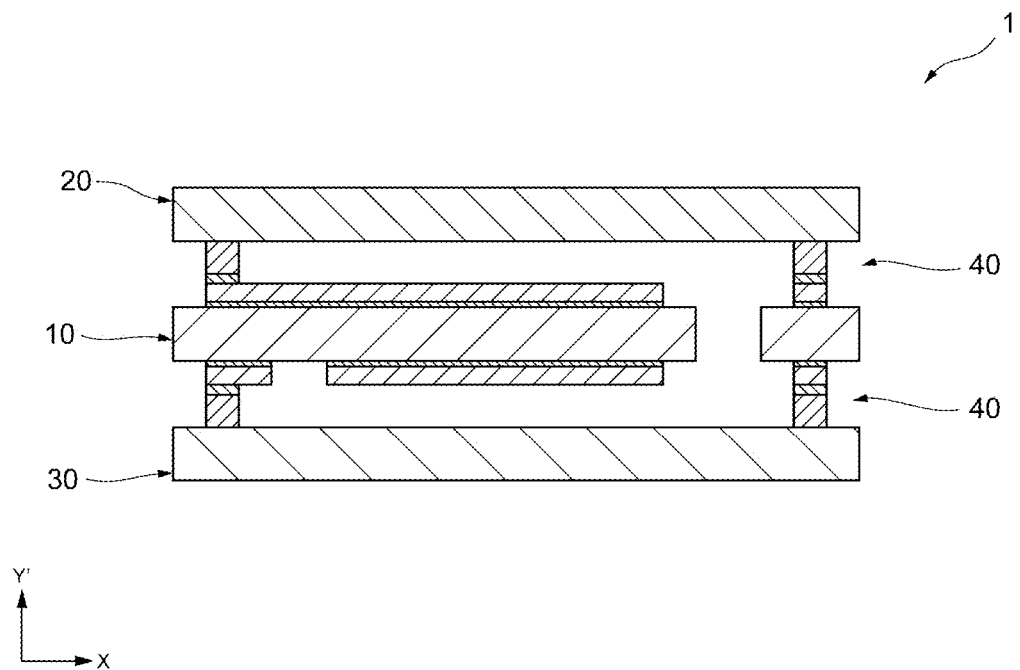
FIG. 8B is a diagram for describing in detail the method for manufacturing the crystal vibrator in Step 40 in FIG. 5.

Next, an example of a method for manufacturing the crystal vibrator 1 according to this embodiment will be described in detail while referring to FIGS. 1 and 5 to 8B. FIG. 5 is a flowchart for describing the method for manufacturing the crystal vibrator 1 according to this embodiment. FIGS. 6A to 6D are diagrams for describing in detail the method for manufacturing the crystal vibration element 10, where FIG. 6A is a diagram for describing in detail Step S10 in FIG. 5, FIG. 6B is a diagram for describing in detail Step S11 in FIG. 5, FIG. 6C is a diagram for describing in detail Step S12 in FIG. 5, and FIG. 6D is a diagram for describing in detail Step S13 in FIG. 5. In addition, FIGS. 7A to 7C are diagrams for describing in detail the method for manufacturing the lid part 20 and the base part 30, where FIG. 7A is a diagram for describing in detail Steps S20 and S30 in FIG. 5, FIG. 7B is a diagram for describing in detail Steps S21 and S31 in FIG. 5, and FIG. 7C is a diagram for describing in detail Steps S22 and S32 in FIG. 5. In addition, FIGS. 8A and 8B are diagrams for describing in detail the method for manufacturing the crystal vibrator 1 in Step 40 in FIG. 5.

Hereafter, for convenience of explanation, the steps of manufacturing the crystal vibrator 1 will be described after describing the steps of manufacturing the crystal vibration element 10, the lid part 20, and the base part 30 in the order of the crystal vibration element 10, the lid part 20, and the base part 30. However, this description does not limit the order in which the steps of manufacturing the crystal vibration element 10, the lid part 20, the base part 30, and the crystal vibrator 1 are performed and the order in which these steps are performed may be different.

Manufacture of Crystal Vibration Element 10

First, the crystal piece 11 is prepared (S10).
Specifically, a flat-plate-shaped crystal piece 11 as illustrated in FIG. 6A is formed by subjecting a crystal wafer to wet etching or dry etching.

Next, etching is performed on the crystal piece 11 (S11).
Specifically, as illustrated in FIG. 6B, a U-shaped cut out part (refer to FIG. 1) that penetrates through the flat-plate-shaped crystal piece 11 prepared in Step S10 is formed in the crystal piece 11 by subjecting the crystal piece 11 to wet etching or dry etching. By forming this U-shaped cut out part, the crystal piece 11 is formed so as to include the central portion 11a, the peripheral portion 11b that is provided so as to surround the central portion 11a along the periphery of the central portion 11a, and the connecting portion 11c that connects the central portion 11a and the peripheral portion 11b to each other.

Next, the first base layers 110 are formed on the main surfaces 12 of the crystal piece 11 (S12).

In this embodiment, the first base layers 110 are base layers consisting of alloy layers included in the excitation electrodes 101, the first sealing frames 102, the lead-out electrodes 103, and the connection electrodes 104 (refer to FIG. 1). Specifically, as illustrated in FIG. 6C, the first base layers 110, which are Ti layers or Cr layers, are formed using a sputtering method on the central portion main surfaces 111 of the central portion 11a, the peripheral portion main surfaces 112 of the peripheral portion 11b, and the connecting portion main surfaces 113 of the connecting portion 11c of the crystal piece 11 formed in Step S11.

In addition, each first base layer 110 is formed to have a thickness of 1 to 20 nm. In addition, each first base layer 110 is preferably formed to have a thickness of 1 to 10 nm.

After that, the first surface layers 120 are formed on the first base layers 110 formed on the main surfaces 12 of the crystal piece 11 (S13).

In this embodiment, the first surface layers 120 are surface layers consisting of alloy layers included in the excitation electrodes 101, the first sealing frames 102, the lead-out electrodes 103, and the connection electrodes 104. Specifically, as illustrated in FIG. 6D, the first surface layers 120, which are Au layers, are formed using a sputtering method on the first base layers 110 formed on the central portion main surfaces 111 of the central portion 11a, the peripheral portion main surfaces 112 of the peripheral portion 11b, and the connecting portion main surfaces 113 of the connecting portion 11c of the crystal piece 11 formed in Step S12.

In addition, each first surface layer 120 is formed to have a thickness of 50 to 500 nm. In addition, each first surface layer 120 is preferably formed to have a thickness of 100 to 200 nm.

Thus, formation of the excitation electrodes 101, the first sealing frames 102, the lead-out electrodes 103, and the connection electrodes 104 on the crystal piece 11 is completed by forming the first base layers 110 and the first surface layers 120, and thus manufacture of the crystal vibration element 10 is completed.

Manufacture of Lid Part 20

First, the lid part crystal piece 21 is prepared (S20).
Specifically, a flat-plate-shaped lid part crystal piece 21 as illustrated in FIG. 7A is formed by subjecting a crystal wafer to wet etching or dry etching.

Next, the second base layer 210 is formed on the main surface 22b of the lid part crystal piece 21 (S21).

In this embodiment, the second base layer 210 is a base layer that is an alloy layer included in the second sealing frame 202. Specifically, as illustrated in FIG. 7B, the second base layer 210, which is a Ni layer, is formed using an electroless or electrolytic plating method on the main surface 22b of the lid part crystal piece 21 prepared in Step S20.

The second base layer 210 is formed to have a thickness of 500 to 5000 nm. In addition, the second base layer 210 is preferably formed to have a thickness of 1000 to 3000 nm. When viewed in relation to the thickness of the first surface layers 120, the thickness of the second base layer 210 is around five times or more that of each first surface layer 120. In addition, the second base layer 210 is preferably formed to have a thickness around ten times or more that of each first surface layer 120. In other words, the second base layer 210 is preferably formed so as to have a thickness that lies in a range from 500 to 5000 nm and is preferably around five times or more the thickness of each first surface layer 120. In addition, the second base layer 210 is more preferably formed so as to have a thickness that lies in a range from 1000 to 3000 nm and is preferably around ten times or more the thickness of each first surface layer 120.

After that, the second surface layer 220 is formed on the second base layer 210 formed on the main surface 22b of the lid part crystal piece 21 (S22).

In this embodiment, the second surface layer 220 is a surface layer that is an alloy layer included in the second sealing frame 202. Specifically, as illustrated in FIG. 7C, the second surface layer 220, which is a AuSn layer, is formed by heating or vapor depositing a metal paste onto the second base layer 210 formed on the main surface 22b of the lid part crystal piece 21 formed in Step S21. Furthermore, the second surface layer 220 is formed so as to be thinner than the second base layer 210.

Thus, formation of the second sealing frame 202 on the lid part crystal piece 21 is completed and manufacture of the lid part 20 is completed by forming the second base layer 210 and the second surface layer 220.

Manufacture of Base Part 30

First, the base part crystal piece 31 is prepared (S30).

Specifically, a flat-plate-shaped base part crystal piece 31 as illustrated in FIG. 7A is formed by subjecting a crystal wafer to wet etching or dry etching.

Next, the second base layer 210 is formed on the main surface 32a of the base part crystal piece 31 (S31).

In this embodiment, the second base layer 210 is a base layer that is an alloy layer included in the second sealing frame 202 and the connection electrode 204. In addition, since the method of forming the second base layer 210 of the base part 30 and the material and the thickness of the material of the second base layer 210 of the base part 30 are the same as those of the second base layer 210 of the lid part 20 described above, detailed description thereof is omitted here.

After that, the second surface layer 220 is formed on the second base layer 210 formed on the main surface 32a of the base part crystal piece 31 (S32).

In this embodiment, the second surface layer 220 is a surface layer that is an alloy layer included in the second sealing frame 202 and the connection electrode 204. In addition, since the method of forming the second surface layer 220 of the base part 30 and the material and the thickness of the material of the second surface layer 220 of the base part 30 are the same as those of the second surface layer 220 of the lid part 20 described above, detailed description thereof is omitted here.

Thus, formation of the second sealing frame 202 and the connection electrode 204 on the base part crystal piece 31 is completed and manufacture of the base part 30 is completed by forming the second base layer 210 and the second surface layer 220.

Manufacture of Crystal Vibrator 1

Next, the crystal vibration element 10 is sealed by bonding the lid part 20 and the base part 30 to the crystal vibration element 10 (S40).

Specifically, as illustrated in FIGS. 8A and 8B, the second surface layers 220 of the second sealing frames 202 of the lid part 20 and the base part 30 are heated and melt and wetly spread over the first surface layers 120 of the first sealing frames 102 on the main surfaces 12 of the crystal vibration element 10. Thus, the crystal vibration element 10 is sealed by the second surface layer 220 of the second sealing frame 202 of the lid part 20 and the first surface layer 120 of the first sealing frame 102 of the first main surface 12a of the crystal vibration element 10 bonding to each other and the second surface layer 220 of the second sealing frame 202 of the base part 30 and the first surface layer 120 of the first sealing frame 102 of the second main surface 12b of the crystal vibration element 10 bonding to each other. In other words, the lid part 20 and the crystal vibration element 10 and the base part 30 and the crystal vibration element 10 are bonded to each other by the sealing layers 40 formed by the second sealing frames 202 and the first sealing frames 102 alloying with each other.

Thus, manufacture of the crystal vibrator 1 is completed by the crystal vibration element 10, the lid part 20, and the base part 30 being bonding together and the crystal vibration element 10 being sandwiched between and sealed by the lid part 20 and the base part 30.

Thus, in this embodiment, by using the first sealing frames 102 and the second sealing frames 202 having the above-described thickness characteristics, the lid part 20 and the base part 30 are able to realize improved stability in terms of bonding to the crystal vibration element 10 and the crystal vibrator 1 having good sealing performance can be obtained. Specifically, the bond between the lid part 20 and the crystal vibration element 10 and the bond between the base part 30 and the crystal vibration element 10 are melt bonds formed by heating the AuSn layers of the second sealing frames 202 of the lid part 20 and the base part 30 and the Au layers of the first sealing frames 102 on the main surfaces 12 of the crystal vibration element 10, that is, alloy bonds between the AuSn layers and the Au layers. Compared to diffusion bonding between a Au layer and a Au layer as described in the related art, this kind of alloy bonding between AuSn layers and Au layers is able to eliminate the problem of unstable diffusion bonding resulting from the main surfaces or the sealing frames of the lid part and the base part having poor flatness and more stable bonding can be realized. Together with this, the level of precision required for the degree of flatness of the main surfaces of the lid part and base part can be relaxed and the processing can be simplified. Therefore an improvement in productivity resulting from a reduction in manufacturing cost can be realized.

Furthermore, in this embodiment, the second base layers 210, which are Ni layers, of the second sealing frames 202 are formed so as to be thicker than the first surface layers 120, which are Au layers, of the first sealing frames 102, and therefore the spacing between the lid part 20 and the crystal vibration element 10 and the spacing between the base part 30 and the crystal vibration element 10 can be adjusted using the second base layers 210, which are Ni layers. As a result, it is possible to suppress the effect on the vibration characteristics of interference between the central portion 11a and the lid part 20 and the base part 30 when the central portion 11a of the crystal vibration element 10 vibrates. In addition, the amount of Au, which is a precious metal, used can be reduced. Therefore, along with realizing improved vibration characteristics for the crystal vibrator 1, it is possible to improve productivity due to the reduced material costs and to reduce the environmental load in manufacture of the precious metal Au.

In addition, in this embodiment, by forming the Au layers of the first sealing frames 102 to be thicker than the Ti layers or Cr layers of the first sealing frames 102, it is possible to secure the Au layer thickness required for bonding to AuSn layers and to improve the strength of the bonds and the reliability of the bonds. Therefore, alloy bonding between the AuSn layers and the Au layers can be reliably and stably carried out and good sealing performance can be obtained.

Furthermore, in this embodiment, since the lid part 20 and the base part 30 are both shaped as flat plates, it is not necessary to form the second sealing frames 202 on narrow parts such as the top surface of a wall part in contrast to the case of a box-shaped lid part or base part and the process of forming the second sealing frames 202 can be simplified. This enables improved productivity to be realized.

An exemplary embodiment of the present invention have been described above.

An embodiment of the present invention provides a method for manufacturing the crystal vibrator 1 that includes the crystal vibration element 10, which includes the crystal piece 11, and the base part 30 and the lid part 20 that sandwich and seal the crystal vibration element 10 therebetween from both sides in a thickness direction. The method includes forming the excitation electrodes 101, the lead-out electrodes 103, the connection electrodes 104, and the first sealing frames 102 on opposed main surfaces 12 of the crystal piece 11 in the thickness direction of the crystal piece 11; forming the second sealing frames 202 on the main surface 32a of the base part 30 and the main surface 22b of the lid part 20; and sealing the crystal vibration element 10 by bonding the second sealing frame 202 of the base part 30 and the first sealing frame 102 of the first main surface 12a of the crystal vibration element 10 to each other and bonding the second sealing frame 202 of the lid part 20 and the first sealing frame 102 of the second main surface 12b of the crystal vibration element 10 to each other. The first sealing frames 102 include the first base layers 110, which are Ti layers or Cr layers, and the first surface layers 120, which are Au layers, provided on the first base layers 110. The first base layers 110 are thinner than the first surface layers 120. The second sealing frames 202 include the second base layers 210, which are Ni layers, and the second surface layers 220, which are AuSn layers, provided on the second base layers 210. The second base layers 210 are thicker than the second surface layers 220. The sealing step includes bonding the base part 30 and the lid part 20 to the crystal vibration element 10 by alloying the first surface layers 120 and the second surface layers 220 to each other.

With this method, improved productivity can be realized and good sealing performance can be obtained through stable bonding.

Furthermore, in the above-described method, at least one out of the base part 30 and the lid part 20 is shaped as a flat plate.

With this method, formation of the sealing layers can be simplified and improved productivity can be realized for the vibrator compared with box-shaped base parts and lid parts.

In addition, in the above-described method, the second base layers 210 have a thickness such that the central portion 11a of the crystal vibration element 10 does not interfere with the base part 30 or the lid part 20 when the crystal vibration element 10 vibrates.

With this method, good vibration characteristics can be obtained.

Furthermore, in the above-described method, the second base layers 210 are thicker than the first surface layers 120.

With this method, good vibration characteristics can be realized and improved productivity can be realized due to reduced material costs.

Furthermore, in the above-described method, the thickness of each first base layer 110 is 1 to 20 nm, the thickness of each first surface layer 120 is 50 to 500 nm, and the thickness of each second base layer 210 is 500 to 5000 nm.

With this method, good sealing performance can be obtained through stable bonding.

In addition, in the above-described method, the thickness of each second base layer 210 is at least five times the thickness of each first surface layer 120.

With this method, good sealing performance can be obtained through stable bonding, and improved productivity can be realized due to reduced material costs.

In addition, in the above-described method, the crystal vibration element 10 is shaped as a flat plate and the shapes of the first sealing frames 102 and the second sealing frames 202 when the crystal vibration element 10 is viewed in plan view are frame shapes that correspond to each other.

With this method, good sealing performance can be obtained through stable bonding.

Furthermore, in the above-described method, the materials of the crystal vibration element 10, the base part 30, and the lid part 20 are crystals.

With this method, improved productivity can be realized for the crystal vibrator and good sealing performance can be obtained through stable bonding.

An embodiment of the present invention provides the crystal vibrator 1 that includes the crystal vibration element 10, which includes the crystal piece 11 and the excitation electrodes 101, the lead-out electrodes 103, and the connection electrodes 104 provided on opposed main surfaces 12 of the crystal piece 11 in the thickness direction of the crystal piece 11, and the base part 30 and the lid part 20 that sandwich and seal the crystal vibration element 10 therebetween from the opposed sides in the thickness direction. The sealing layers 40, which are for bonding the base part 30 and the lid part 20 to the crystal vibration element 10, are provided between the base part 30 and the crystal vibration element 10 and between the lid part 20 and the crystal vibration element 10. Each sealing layer 40 includes the first base layer 110, which is a Ti layer or a Cr layer, the first surface layer 120, which is a Au layer, the second surface layer 220, which is a AuSn layer, and the second base layer 210, which is a Ni layer, from the crystal vibration element 10 toward the base part 30 or the lid part 20. Each sealing layer 40 includes an alloy layer 150, which is formed by part of the first surface layer 120 alloying with the second surface layer 220, between the first surface layer 120 and the second surface layer 220. The first base layers 110 are thinner than first surface layers 120. The second base layers 210 are thicker than the second surface layers 220.

With this configuration, improved productivity can be realized and good sealing performance can be obtained through stable bonding.

Furthermore, in the above-described configuration, at least one out of the base part 30 and the lid part 20 is shaped as a flat plate.

With this configuration, formation of the sealing layers can be simplified and improved productivity can be realized for the vibrator compared with box-shaped base parts and lid parts.

Furthermore, in the above-described configuration, the thickness of each first base layer 110 is 1 to 20 nm, the thickness of each first surface layer 120 is 50 to 500 nm, and the thickness of each second base layer 210 is 500 to 5000 nm and is at least five times the thickness of each first surface layer 120.

With this configuration, good sealing performance can be obtained through stable bonding, and improved productivity can be realized due to reduced material costs.

In addition, in the above-described configuration, the crystal vibration element 10 is shaped as a flat plate and the materials of the crystal vibration element 10, the base part 30, and the lid part 20 are crystals.

With this configuration, improved productivity can be realized for the crystal vibrator and good sealing performance can be obtained through stable bonding.

Modifications

The present invention is not limited to the above-described embodiments and can be modified and used in various ways. Hereafter, modifications of the present invention will be described.

In the above embodiment, the method for manufacturing the crystal vibrator 1 is described as manufacturing method in which each crystal vibrator 1 is manufactured by bonding the crystal vibration element 10, the lid part 20, and the base part 30 to each other, but the present invention is not limited to the above-described manufacturing method. For example, the manufacturing method may be a method in which a plurality of the crystal vibrators 1 are formed by forming a wafer by bonding together a crystal vibration element 10', a lid part 20', and a base part 30', with which a plurality of the crystal vibration elements 10, lid parts 20, and base parts 30 can be formed, and then cutting the wafer into individual pieces.

In the above embodiment, the second sealing frame 202*b* provided on the lid part 20 and the second sealing frame 202*a* provided on the base part 30 are described as having the same configuration, but they are not limited to this configuration, and the second sealing frame 202*b* and the second sealing frame 202*a* may instead have different configurations from each other. For example, the second sealing frame 202*b* and the second sealing frame 202*a* may include the same materials, i.e., the second base layer 210, which is a Ni layer, and the second surface layer 220, which is a AuSn layer, but the thickness of the second base layer 210 and the thickness of the second surface layer 220 of the second sealing frame 202*b* may be different from the thickness of the second base layer 210 and the thickness of the second surface layer 220 of the second sealing frame 202*a*. In addition, the second sealing frame 202*b* and the second sealing frame 202*a* may include different materials. Furthermore, the second sealing frame 202*b* and the second sealing frame 202*a* may be each formed of three or more different metal layers. The second surface layers 220 of the second sealing frame 202*a* and the second sealing frame 202*b* are preferably AuSn layers in order to obtain good bonding performance.

In the above embodiment, it is described that the plan view shapes of the first sealing frames 102 and the second sealing frames 202 are frames in which both the inner peripheral surface and the outer peripheral surface are rectangular shaped, but the present invention is not limited to this configuration. The first sealing frames 102 and the second sealing frames 202 may be any shape that can be disposed on the peripheral portion 11*b*, and for example, the plan view shapes may be elliptical shapes and so forth. In addition, the first sealing frames 102 and the second sealing frames 202 have been described as having the same plan view shape, but may instead have different plan view shapes. However, in order to obtain good bonding performance, it is preferable that the second sealing frame 202*b* provided on the lid part 20 and the first sealing frame 102*a* of the crystal vibration element 10 have the same plan view shape and that the second sealing frame 202*a* provided on the base part 30 and the first sealing frame 102*b* of the crystal vibration element 10 have the same plan view shape.

In the above embodiment, the crystal piece 11, which is an example of a vibration piece, is described as being an AT cut crystal piece having long sides that are parallel to the X axis and short sides that are parallel to the Z' axis, but not limited to this configuration, for example, an AT cut crystal piece having long sides that are parallel to the Z' axis and short sides that are parallel to the X axis may be used. Alternatively, provided that the main vibration is a thickness shear vibration mode, the crystal piece may be a crystal piece of a different cut other than an AT cut, such as a BT cut. However, an AT-cut crystal piece, which allows very high frequency stability to be obtained over a wide range of temperatures, is most preferred. Furthermore, rather than using the crystal piece 11, another material having thickness slip vibration as a main vibration may be used as the vibration piece.

In the above embodiment, the materials of the lid part 20 and the base part 30 are described as being crystal, but are not limited to this material, and may be any of various single-layered materials such as a ceramic, for example. The lid part 20 and base part 30 may be composed of insulating materials or multi-layered materials composed of conductive and insulating materials.

In the above embodiment, the lid part 20 and base part 30 are described as being shaped as flat plates, but may instead have shapes other than that of flat plates. However, in order to simplify the process of forming the second sealing frames 202, it is preferable to make the main surfaces of the lid part 20 and the base part 30 where the second sealing frames 202 are to be provided flat or to form the areas of the parts of the lid part 20 and the base part 30 where the second sealing frames 202 are to be provided sufficiently wide.

The purpose of the embodiments described above is to enable easy understanding of the present invention and the embodiments are not to be interpreted as limiting the present invention. The present invention can be modified or improved without departing from the gist of the invention and equivalents to the present invention are also included in the present invention. In other words, appropriate design changes made to the embodiments by one skilled in the art are included in the scope of the present invention so long as the changes have the characteristics of the present invention. For example, the elements included in the embodiments and the arrangements, materials, conditions, shapes, sizes and so forth of the elements are not limited to those exemplified in the embodiments and can be changed as appropriate. In addition, each embodiment is merely an illustrative example and it goes without saying that parts of the configurations illustrated in different embodiments can be substituted for each other or combined with each other and these new configurations are also included in the scope of the present invention so long as the configurations have the characteristics of the present invention.

REFERENCE SIGNS LIST

1 . . . crystal vibrator, 10 . . . crystal vibration element, 11 . . . crystal piece, 11a . . . central portion, 11b . . . peripheral portion, 11c . . . connecting portion, 12 . . . main surface, 12a . . . first main surface, 12b . . . second main surface, 20 . . . lid part, 21 . . . lid part crystal piece, 30 . . . base part, 31 . . . base part crystal piece, 40 . . . sealing layer, 100 . . . first metal layer, 101, 101a, 101b . . . excitation electrode, 102, 102a, 102b . . . first sealing frame, 103, 103a, 103b . . . lead-out electrode, 104, 104a, 104b . . . connection electrode, 110 . . . first base layer, 120 . . . first surface layer, 150 . . . alloy layer, 202, 202a, 202b . . . second sealing frame, 210 . . . second base layer, 220 . . . second surface layer

The invention claimed is:

1. A vibrator comprising:
a vibration element that includes a vibration piece and excitation electrodes and connection electrodes on a first main surface and a second main surface of the vibration piece that are opposed to each other in a thickness direction of the vibration piece; and
a lid part opposing the first main surface of the vibration element;
a base part opposing the second main surface of the vibration element such that the lid part and the base part sandwich and seal the vibration element therebetween; and
respective sealing layers between the base part and the vibration element and between the lid part and the vibration element, the sealing layers each including:
a first Ti or Cr base layer,
a first Au surface layer,
an alloy layer,
a second AuSn surface layer, and
a second Ni base layer, each being arranged from the vibration element toward the base part and/or from the vibration element toward the lid part, and wherein
the alloy layer is an alloy of the first Au surface layer and the second AuSn surface layer,
the first Ti or Cr base layers are thinner than the first Au surface layers, and
the second Ni base layers are thicker than the second AuSn surface layers.

2. The vibrator according to claim 1, wherein at least one out of the base part and the lid part is shaped as a flat plate.

3. The vibrator according to claim 1, wherein the second Ni base layers have a thickness such that a vibration part of the vibration element does not interfere with the base part or the lid part when the vibration element vibrates.

4. The vibrator according to claim 1, wherein the second Ni base layers are thicker than the first Au surface layers.

5. The vibrator according to claim 1,
wherein a thickness of each first Ti or Cr base layer is 1 to 20 nm,
a thickness of each first Au surface layer is 50 to 500 nm, and
a thickness of each second Ni base layer is 500 to 5000 nm and is at least 5 times the thickness of each first surface layer.

6. The vibrator according to claim 5, wherein the thickness of each second Ni base layer is at least 5 times the thickness of each first Au surface layer.

7. The vibrator according to claim 1, wherein the vibration element is shaped as a flat plate and shapes of the first sealing layers and the second sealing layers when the vibration element is viewed in plan view are frame shapes that correspond to each other.

8. The vibrator according to claim 1, wherein materials of the vibration element, the base part, and the lid part are crystals.

* * * * *